(12) United States Patent
Takewaki et al.

(10) Patent No.: US 12,080,621 B2
(45) Date of Patent: Sep. 3, 2024

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Yoshiaki Takewaki, Tokyo (JP); Keita Motoyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 17/460,962

(22) Filed: Aug. 30, 2021

(65) Prior Publication Data
US 2022/0173009 A1 Jun. 2, 2022

(30) Foreign Application Priority Data

Nov. 27, 2020 (JP) .................................. 2020-196575

(51) Int. Cl.
*H01L 23/00* (2006.01)
*H01L 21/48* (2006.01)
*H01L 23/373* (2006.01)

(52) U.S. Cl.
CPC ...... *H01L 23/3735* (2013.01); *H01L 21/4807* (2013.01); *H01L 24/32* (2013.01); *H01L 24/48* (2013.01); *H01L 24/73* (2013.01); *H01L 2224/32225* (2013.01); *H01L 2224/48225* (2013.01); *H01L 2224/73265* (2013.01)

(58) Field of Classification Search
CPC . H01L 23/3735; H01L 21/4807; H01L 24/32; H01L 24/48; H01L 24/73; H01L 2224/32225; H01L 2224/48225; H01L 2224/73265; H01L 23/053; H01L 23/24; H01L 24/45; H01L 2224/45124; H01L 2224/48091; H01L 2224/48227; H01L 23/49811; H01L 21/52; H01L 21/67138;
(Continued)

(56) References Cited

U.S. PATENT DOCUMENTS 9,824,961 B2 11/2017 Kadoguchi et al.
9,953,905 B2 4/2018 Kadoguchi et al.
(Continued)

FOREIGN PATENT DOCUMENTS

DE 11 2017 002 424 T5 1/2019
DE 11 2014 005 420 B4 2/2021
(Continued)

OTHER PUBLICATIONS

An Office Action mailed by the Japanese Patent Office on Aug. 22, 2023, which corresponds to Japanese Application No. 2020-196575 with English translation.

*Primary Examiner* — Elias Ullah
(74) *Attorney, Agent, or Firm* — Studebaker & Brackett PC

(57) ABSTRACT

Provided is a semiconductor device capable of suppressing misalignment of a brazing material when bonding a metal terminal to a metal circuit pattern. The semiconductor device includes an insulating substrate with a metal circuit pattern formed in a surface thereof and a metal terminal bonded onto the metal circuit pattern via a hard brazing material, in which protrusions are provided on the metal circuit pattern, and the protrusions are in contact with the hard brazing material.

14 Claims, 18 Drawing Sheets

(58) Field of Classification Search
CPC ............... H01L 21/67144; H01L 23/49; H01L 2021/60067
See application file for complete search history.

(56) References Cited

U.S. PATENT DOCUMENTS

| | | | |
|---|---|---|---|
| 2013/0020725 | A1 | 1/2013 | Onishi et al. |
| 2016/0293561 | A1 | 10/2016 | Kadoguchi et al. |
| 2016/0343641 | A1* | 11/2016 | Hori ..................... H01L 25/072 |
| 2017/0025331 | A1 | 1/2017 | Kamiyama et al. |
| 2017/0243812 | A1 | 8/2017 | Kadoguchi et al. |
| 2019/0143434 | A1* | 5/2019 | Yoneda ............. H01L 23/53228 257/741 |

FOREIGN PATENT DOCUMENTS

| | | |
|---|---|---|
| JP | 2004-134703 A | 4/2004 |
| JP | 2004-363216 A | 12/2004 |
| JP | 2019-133965 A | 8/2019 |
| WO | 2012-073572 A1 | 6/2012 |
| WO | 2016/084483 A1 | 6/2016 |

\* cited by examiner

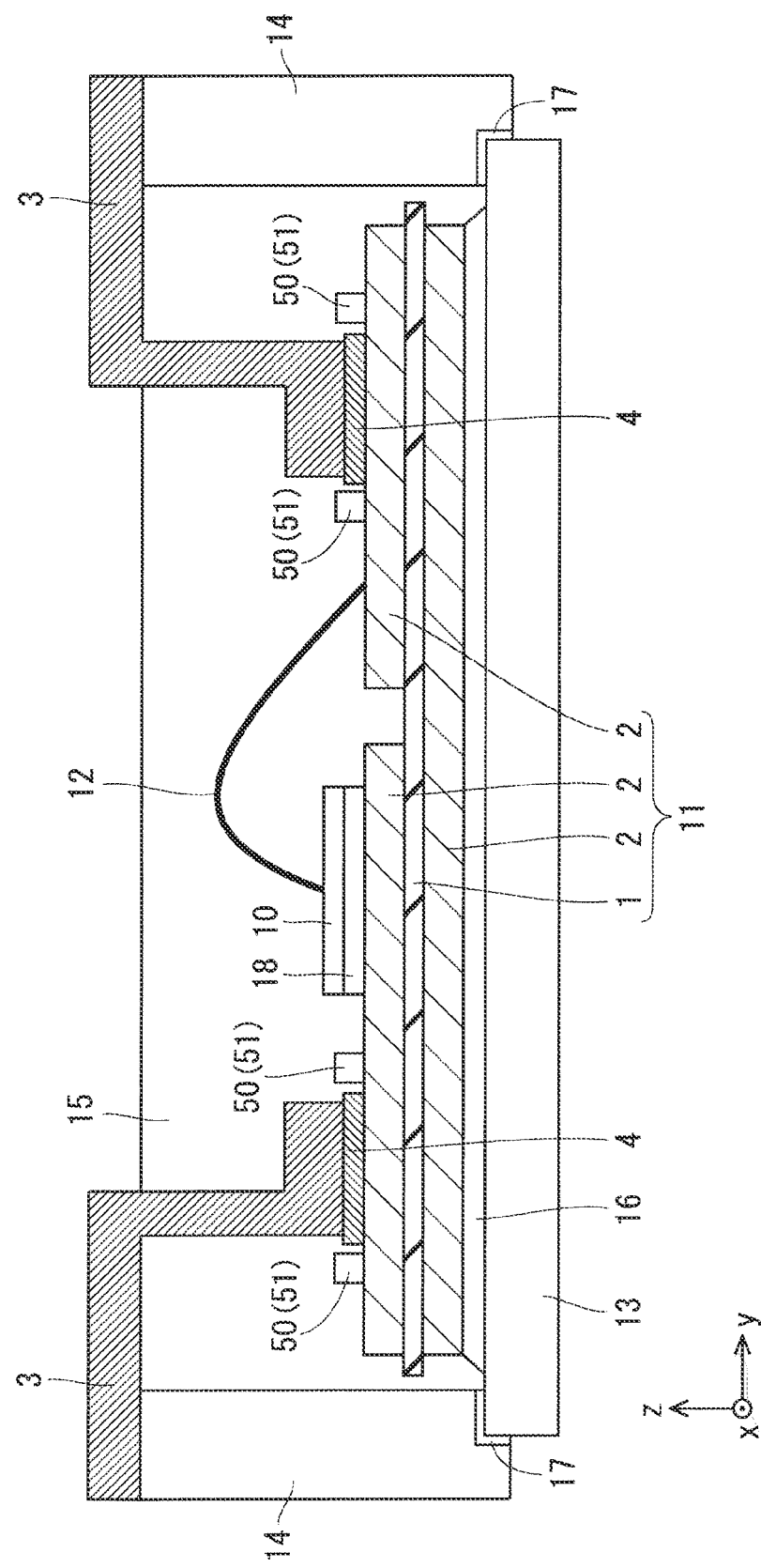

F I G. 8
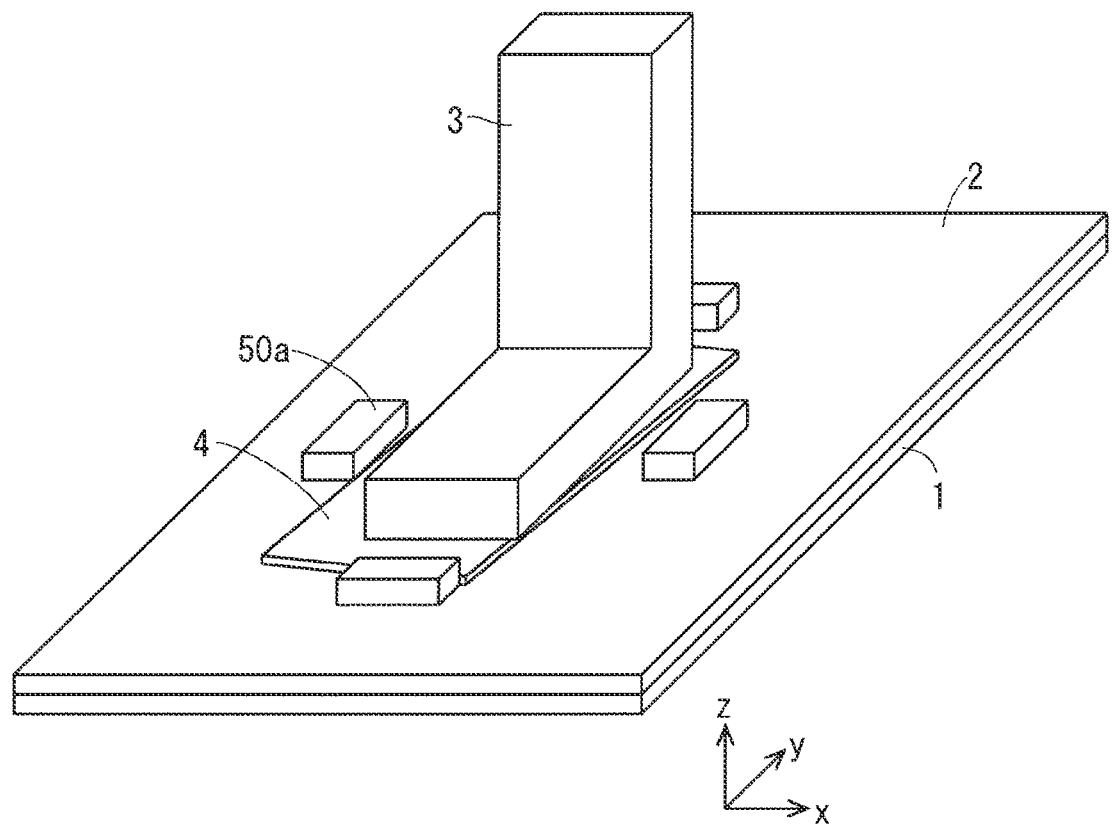

F I G. 1 4
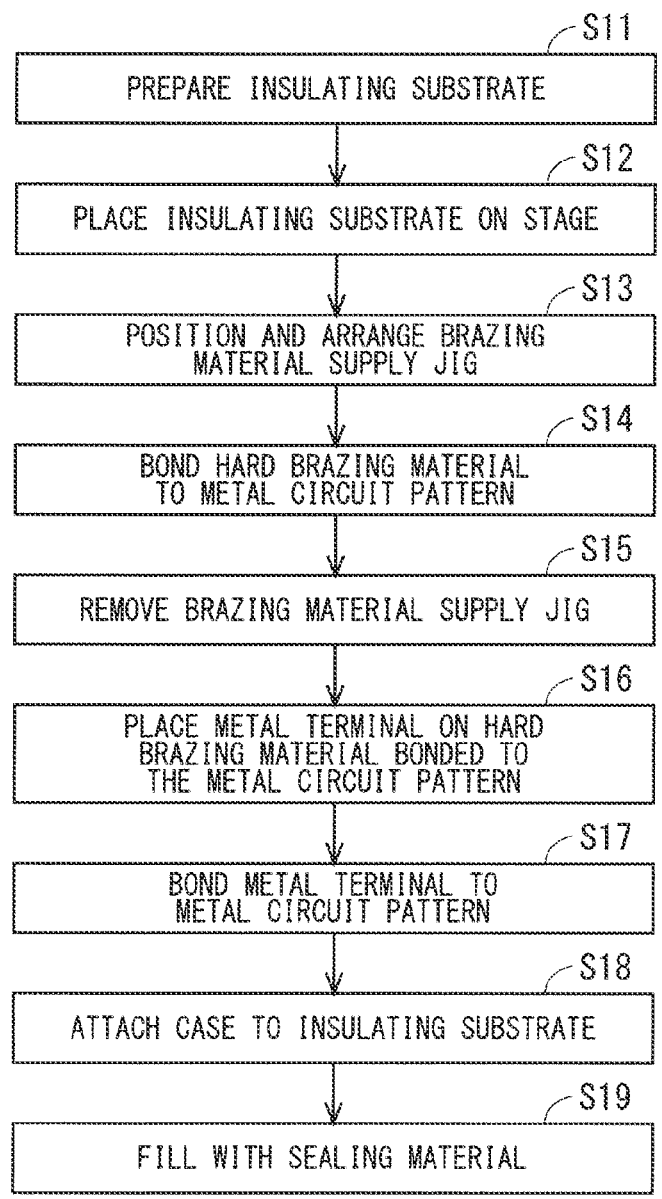

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

In a semiconductor device, brazing is performed in some cases in order to firmly bond an insulating substrate with a metal circuit pattern formed on the surface of an insulating layer and a metal terminal. For example, Japanese Patent Application Laid-Open No. 2004-134703 discloses a configuration in which terminals are brazed to a metal circuit pattern.

SUMMARY

In brazing between the insulating substrate and the terminal, there is a problem that the position of the brazing material used for brazing is misaligned.

The semiconductor device of the present disclosure includes an insulating substrate with a metal circuit pattern formed in a surface thereof and a metal terminal bonded onto the metal circuit pattern via a hard brazing material. Protrusions are provided on the metal circuit pattern, and the protrusions are in contact with the hard brazing material.

The contact of the protrusions to the hard brazing material suppresses misalignment of the brazing material when bonding a metal terminal to a metal circuit pattern.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of a semiconductor device of Embodiments 1 to 6;

FIG. 8 is a partial perspective view of a semiconductor device of Embodiment 3;

FIG. 14 is a flowchart of a method of manufacturing a semiconductor device of a comparative example;

DESCRIPTION OF THE PREFERRED EMBODIMENTS

A. Embodiment 1

<A-1. Configuration>

Figure 2:
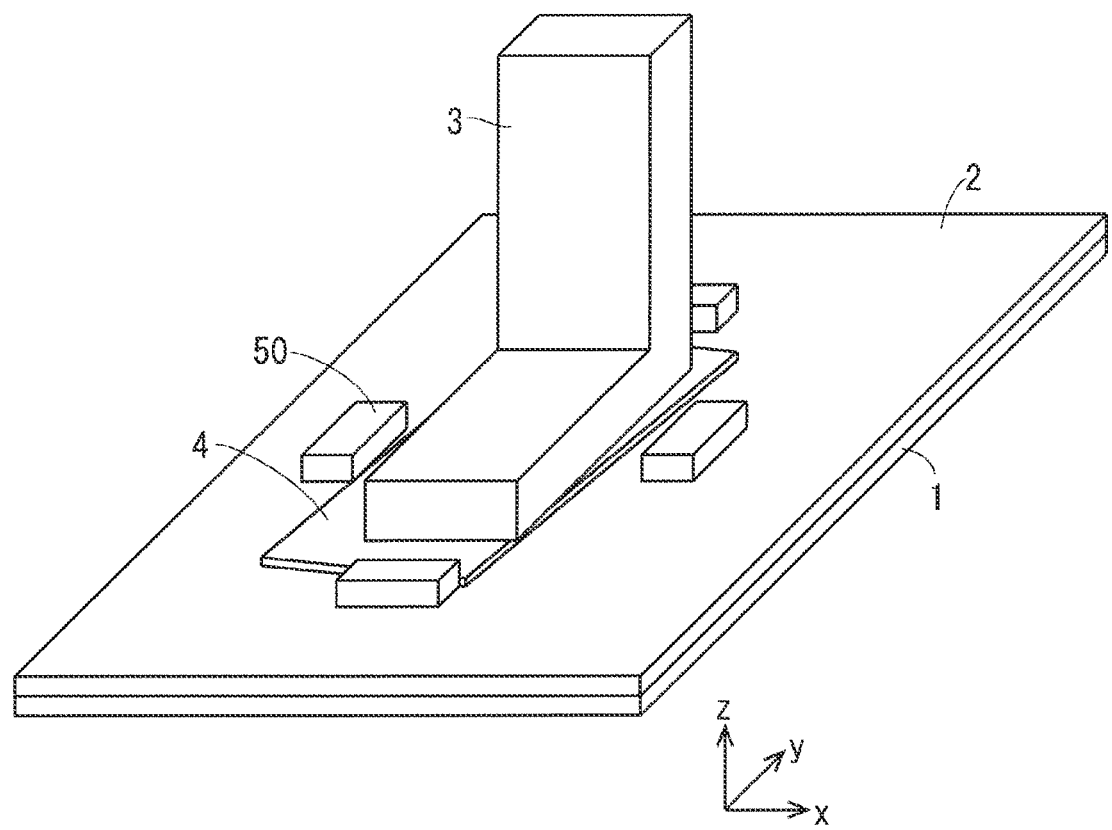
FIG. 2 is a partial perspective view of a semiconductor device of Embodiment 1.

FIG. 1 is a cross-sectional view of a semiconductor device 100 according to Embodiment 1.

The semiconductor device 100 includes a semiconductor element 10, an insulating substrate 11, a metal wire 12, metal terminals 3, hard brazing materials 4, a heat radiation plate 13, a resin case 14, and a sealing material 15.

The insulating substrate 11 includes an insulating layer 1 and metal circuit patterns 2. The material of the insulating layer 1 is, for example, ceramic. The metal circuit patterns 2 are formed on the surfaces of the insulating substrate 11. The material of the metal circuit patterns 2 is, for example, copper.

The semiconductor element 10 is a power semiconductor element such as an Insulated Gate Bipolar Transistor (IGBT) or a Free Wheeling Diode (FWD). The semiconductor element 10 is bonded to the metal circuit pattern 2 with a bonding material 18. The bonding material 18 is, for example, solder. The metal circuit patterns 2 are a plurality of divided portions, and the semiconductor element 10 and the portion of the metal circuit pattern 2 different from the portion to which the semiconductor element 10 is bonded are connected by the metal wire 12. The metal wire 12 is, for example, an aluminum wire.

The insulating substrate 11 is bonded to the heat radiation plate 13 with a bonding material 16 such as solder, arranged in the resin case 14 together with the semiconductor element 10, the metal wire 12, and the like, and protected by the sealing material 15. The resin case 14 surrounds the insulating substrate 11 and is adhered to the heat radiation plate 13 with an adhesive 17. The material of the resin case 14 is, for example, the Poly Phenylene Sulfide Resin (PPS). The sealing material 15 is, for example, a silicone gel.

The metal terminals 3 is brazed with the hard brazing materials 4 on the metal circuit patterns 2 formed in the surface of the insulating substrate 11. The metal terminals 3 are terminals for electrically connecting the semiconductor device 100 to an external circuit.

FIG. 2 is a partial perspective view illustrating an extracted portion of the semiconductor device 100 in which the metal terminal 3 is bonded to the metal circuit pattern 2.

Figure 3:
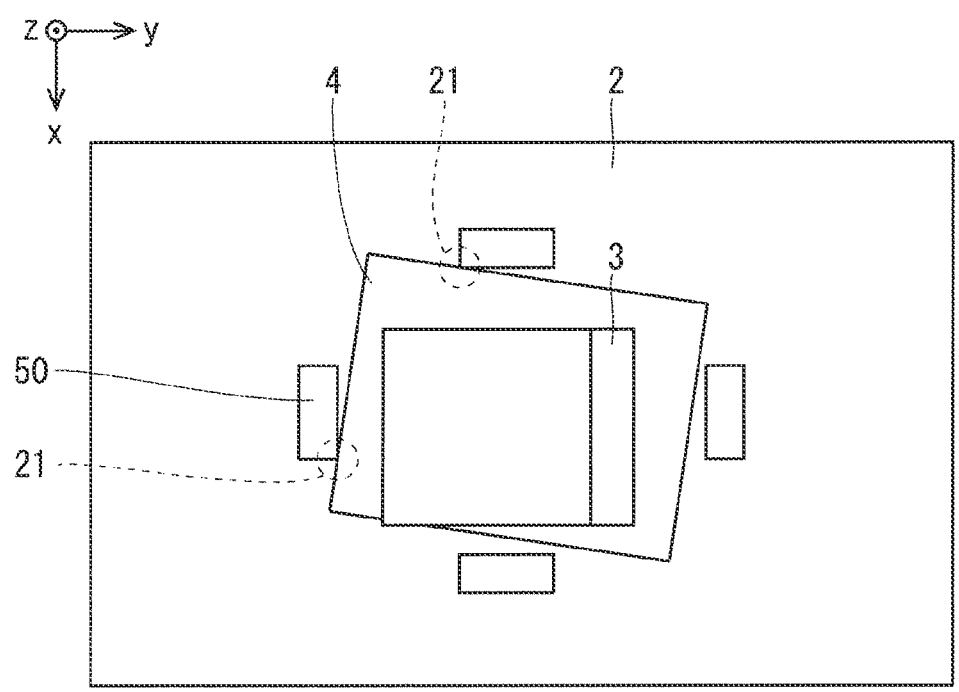
FIG. 3 is a partial top view of the semiconductor device of Embodiment 1.

As illustrated in FIG. 2, protrusions 50 are provided on the metal circuit pattern 2. The protrusions 50 are discretely arranged around the region where the metal terminal 3 is bonded to the metal circuit pattern 2, and discretely surround the region. FIG. 3 is a top view of the same area as illustrated in FIG. 2. As illustrated in FIG. 3, somewhere in one or more portions of the protrusions 50 are in contact with the hard brazing material 4. In FIG. 3, the protrusions 50 and the hard brazing material 4 are in contact with each other in the regions 21 surrounded by the broken lines. The hard brazing material 4 is arranged in a region surrounded by the protrusions 50, and the protrusions 50 are not covered with the hard brazing material 4. Accordingly, the in-plane directional misalignment of the hard brazing material 4 at the point when the metal terminal 3 is bonded to the metal circuit pattern 2 is easily suppressed.

<A-3. Method of Manufacturing>

Figure 4:
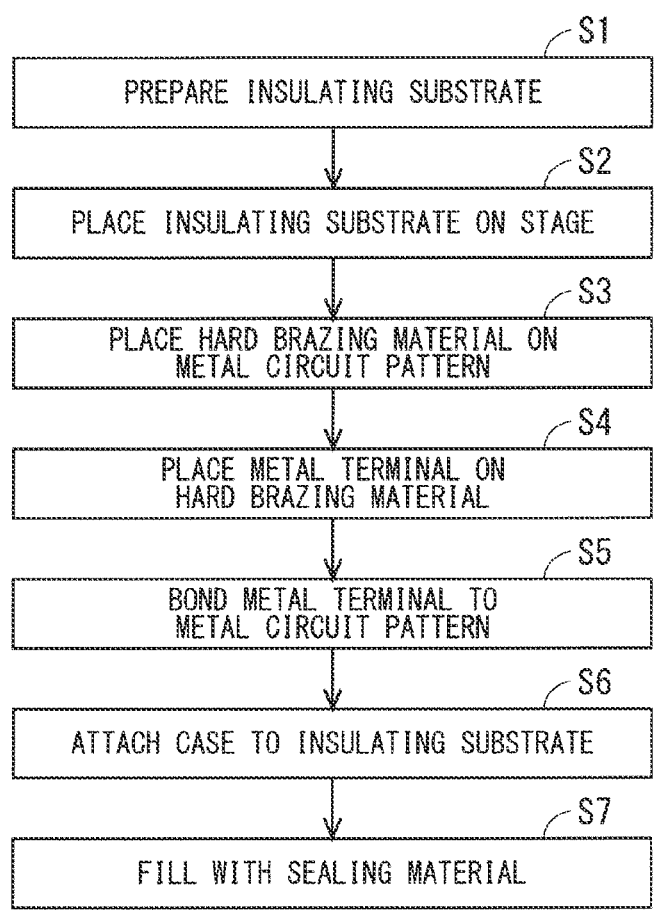
FIG. 4 is a flowchart of the semiconductor device of Embodiment 1.

FIG. 4 is a flowchart of a method of manufacturing the semiconductor device 100.

First, the insulating substrate 11 in which the metal circuit pattern 2 is formed in the surface and the protrusions 50 are formed on the metal circuit pattern 2 is prepared (Step S1).

Next, the insulating substrate 11 is placed on a stage (Step S2).

Next, the hard brazing material 4 is placed on the metal circuit pattern 2 of the insulating substrate 11 (Step S3). In Step S3, the hard brazing material 4 is arranged in the region surrounded by the protrusions 50 such that the hard brazing material 4 is in contact with the protrusions 50. The hard brazing material 4 is preferably a plate-shaped material from the viewpoint of ease of handling, and a phosphor copper brazing material which can be used without flux is suitable therefor.

Next, the metal terminal 3 is placed on the hard brazing material 4 placed on the metal circuit pattern 2 (Step S4).

Next, the hard brazing material 4 is heated via the metal terminal 3 with a laser or the like to melt the hard brazing material 4. As a result, the metal terminal 3 is bonded to the metal circuit pattern 2 via the hard brazing material 4 (Step S5).

Next, the resin case 14 is attached to the insulating substrate 11 (Step S6), and the resin case 14 is filled with the sealing material 15 (Step S7).

Through above Steps, the semiconductor device 100 is completed. In the above description, steps that are not directly related to the bonding between the metal terminal 3 and the metal circuit pattern 2 are omitted.

Figure 18:
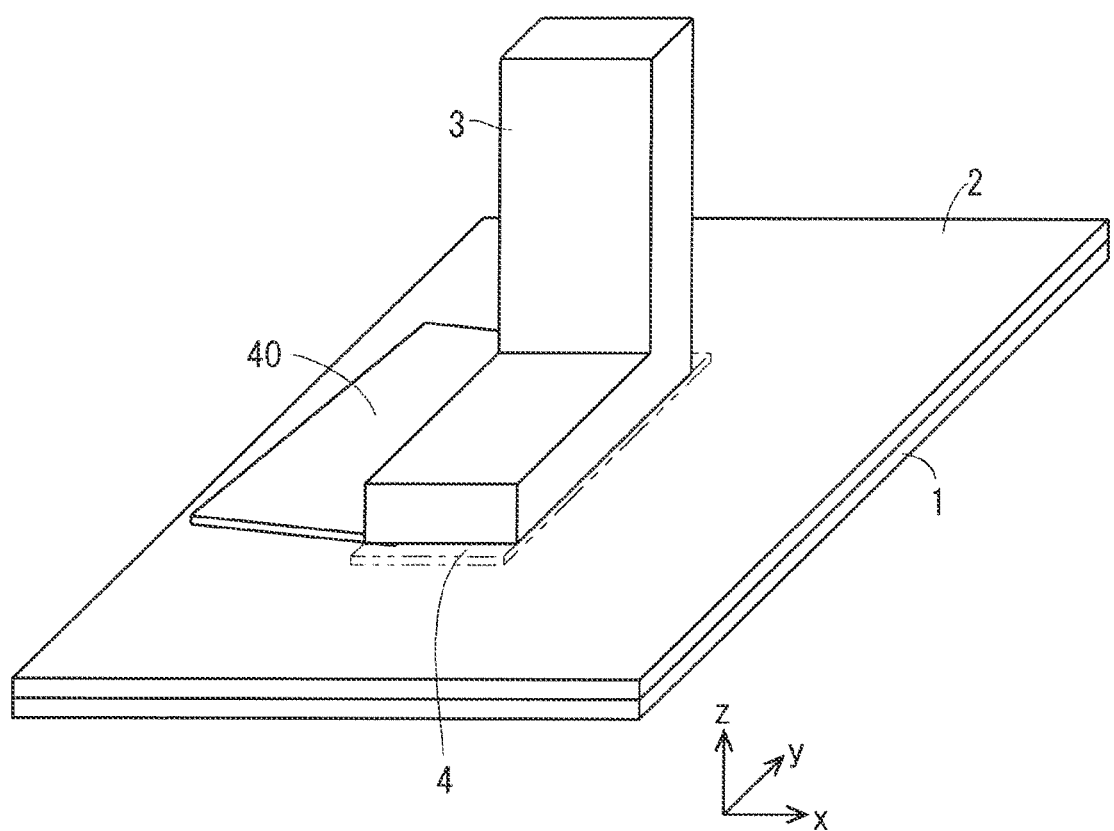
FIG. 18 is a diagram illustrating a state where the semiconductor device of Embodiment 1 has no protrusions.

In a case of no protrusions 50, misalignment of the positions of the hard brazing material 4 and the metal terminal 3 could happen between Steps S3 and S5. For example, as illustrated in FIG. 18, when the hard brazing material 4 is misaligned from the original position to the position of the hard brazing material 40, the metal terminal 3 and the metal circuit pattern 2 are not properly bonded.

Meanwhile, in the method of manufacturing the semiconductor device 100, the insulating substrate 11 having the metal circuit pattern 2 formed in its surface and having the protrusions 50 formed on the metal circuit pattern 2 is prepared, and the hard brazing material 4 is arranged on the metal circuit pattern 2 so as to be in contact with the protrusions 50, and the metal terminal 3 is bonded to the metal circuit pattern 2 via the hard brazing material 4. As illustrated in FIG. 2, the brazing can be performed with the misalignment of the hard brazing material 4 suppressed, by forming the protrusions 50 on the metal circuit pattern 2 in advance so as to surround the region to which the metal terminal 3 is bonded. As a result, stabilization of bonding quality can be expected.

<A-3. Others>

In Embodiment 1, although the description has been made that the material of the insulating layer 1 of the insulating substrate 11 is, for example, ceramic, the material is not limited thereto, and the material of the insulating layer 1 may be, for example, a resin.

Further, in Embodiment 1, although the description has been made that the material of the metal circuit pattern 2 of the insulating substrate 11 is, for example, copper, the material is not limited thereto, and for example, aluminum may also be adoptable. In that case, a material other than phosphor copper brazing material may also be adopted as the hard brazing material, and a material having good wettability to aluminum may be used as the hard brazing material.

Further, in Embodiment 1, although it has been described that the hard brazing material 4 is preferably a plate-shaped, a rod-shaped hard brazing material may also be used.

Further, in Embodiment 1, although the case has been describe where the bonding material 18 being the die-bonding material for bonding the semiconductor element 10 and the metal circuit pattern 2 is solder, the bonding material is not limited thereto, and the bonding material 18 may also be a bonding material containing silver or copper particles having sinterability. By using a bonding material having sinterability as the die-bonding material, the lifetime of the bonding portion between the semiconductor element 10 and the metal circuit pattern 2 can be improved from the case of the bonding using solder.

Further, in Embodiment 1, although an IGBT is mentioned as an example of the semiconductor element 10, a Metal Oxide Semiconductor Field Effect Transistor (MOSFET) may also be adopted.

Further, in Embodiment 1, although an FWD is mentioned as an example of the semiconductor element 10, a Schottky Diode (SBD) may also be adopted.

<A-4. Effects>

The protrusions 50 are provided on the metal circuit pattern 2 and the protrusions 50 are in contact with the hard brazing material 4. Accordingly, misalignment of the hard brazing material 4 at the point when the metal terminal 3 is bonded to the metal circuit pattern 2 is suppressed.

The protrusions 50 are arranged so as to surround the region where the metal terminal 3 is bonded to the metal circuit pattern 2. Accordingly, misalignment of the hard brazing material 4 at the point when the metal terminal 3 is bonded to the metal circuit pattern 2 is suppressed even further.

The protrusions 50 are arranged so as to discretely surround the region where the metal terminal 3 is bonded to the metal circuit pattern 2. As a result, the forming of the protrusions 50 is easily performed.

The protrusions 50 are not covered with the hard brazing material 4. Accordingly, misalignment of the hard brazing material 4 at the point when the metal terminal 3 is bonded to the metal circuit pattern 2 is easily suppressed.

B. Embodiment 2

FIG. 1 is a cross-sectional view of a semiconductor device 101 of Embodiment 2.

Figure 5:
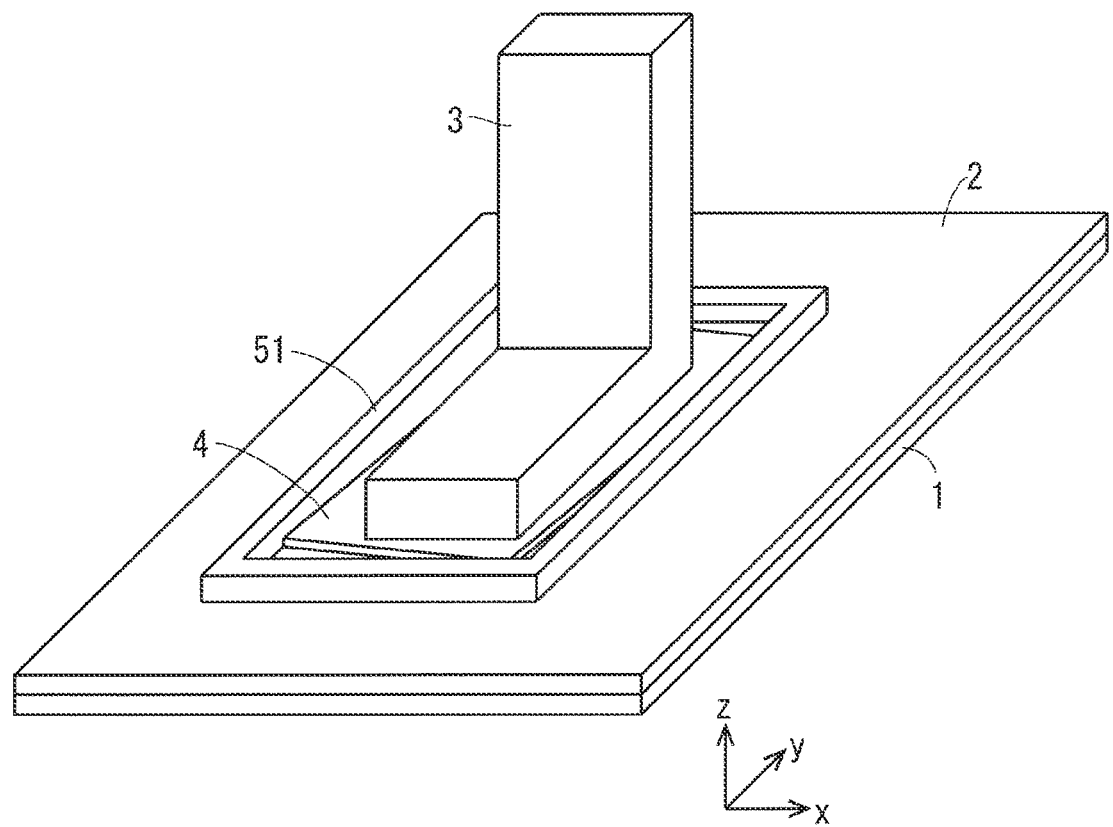
FIG. 5 is a partial perspective view of a semiconductor device of Embodiment 2.

FIG. 5 is a partial perspective view of the semiconductor device 101.

The semiconductor device 101 is different from the semiconductor device 100 of Embodiment 1 in that a protrusion 51 is provided on the metal circuit pattern 2 instead of the protrusions 50. The semiconductor device 101 is otherwise similar to the semiconductor device 100.

The protrusion 51 is arranged so as to continuously surround the region where the metal terminal 3 is bonded to the metal circuit pattern 2. Also, somewhere in one or more portions of the protrusions 51 are in contact with the hard brazing material 4.

Figure 6:
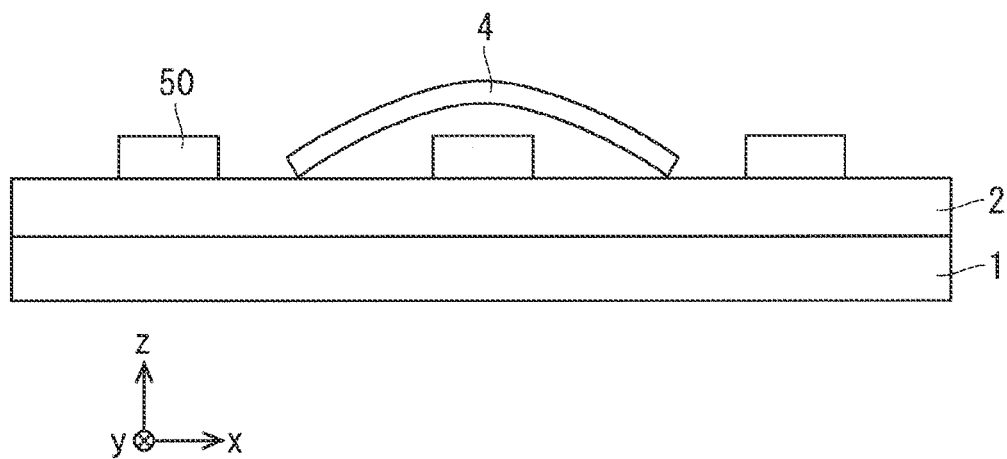
FIG. 6 is a diagram for explaining the effect of the configuration of the semiconductor device of Embodiment 2.
Figure 7:
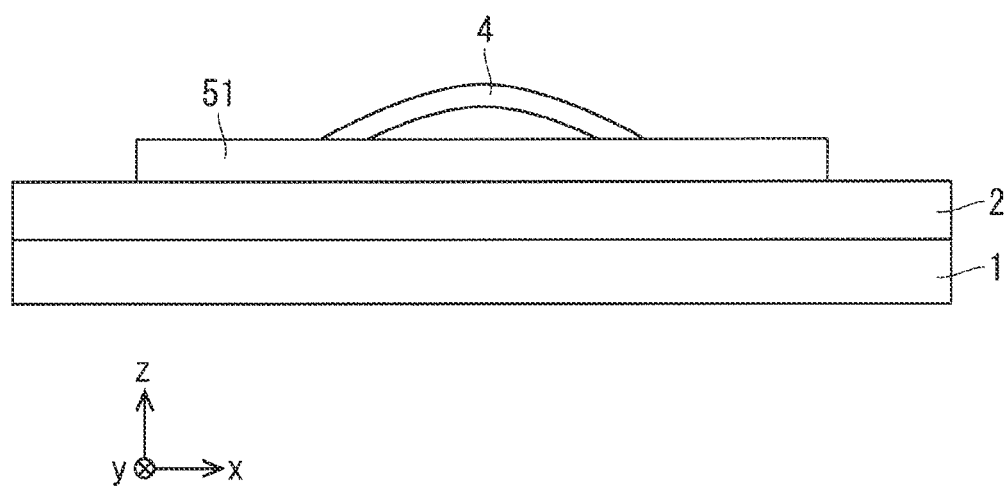
FIG. 7 is a diagram for explaining the effect of the configuration of the semiconductor device of Embodiment 2.

The effect of suppressing the misalignment of the hard brazing material 4 is more stably obtained than in the case, as illustrated in FIG. 6, where the protrusions 50 are discretely provided as described in Embodiment 1 by continuously surrounding the hard brazing material 4 with the protrusion 51 as illustrated in FIG. 7, even when the plate-shaped hard brazing material 4 is warped, for example, during the manufacturing of the semiconductor device 101.

C. Embodiment 3

FIG. 1 is a cross-sectional view of a semiconductor device 102 according to Embodiment 3.

FIG. 8 is a partial perspective view of the semiconductor device 102.

In the semiconductor device 102, protrusions 50a are metal wire bumps formed by bonding metal wires onto the metal circuit pattern 2. The semiconductor device 102 is similar to the semiconductor device 100, except that the protrusions 50a being metal wire bumps are provided as the protrusions 50. Also in the semiconductor device 102, somewhere in one or more portions of the protrusions 50a are in contact with the hard brazing material 4 as in the semiconductor device 100.

The protrusions 50a being metal wire bumps, can be formed at low cost; therefore, by forming the protrusions 50a as metal wire bumps, the effect of suppressing the manufacturing cost can be obtained in addition to the effect of Embodiment 1.

D. Embodiment 4

FIG. 1 is a cross-sectional view of a semiconductor device 103 according to Embodiment 4.

Figure 9:
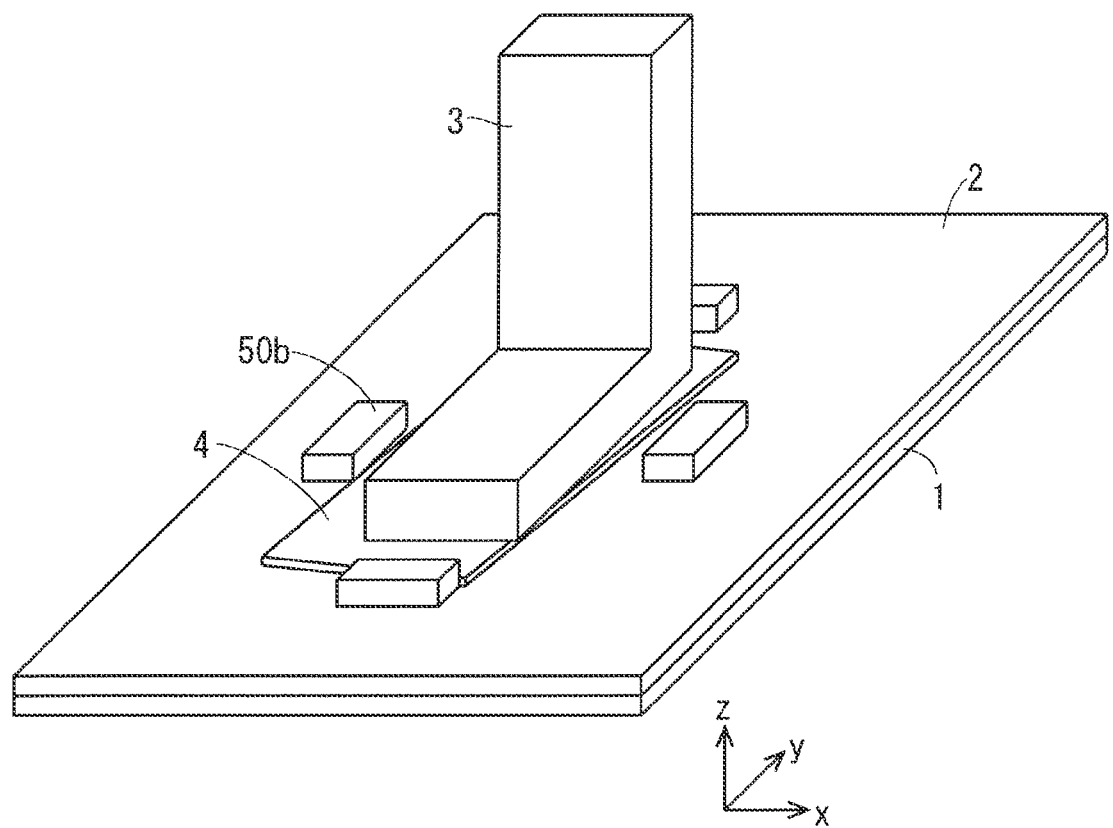
FIG. 9 is a partial perspective view of a semiconductor device of Embodiment 4.

FIG. 9 is a partial perspective view of the semiconductor device 103.

In the semiconductor device 103, protrusions 50 are protrusions 50b containing an insulating material, and in particular, the protrusions 50b are formed of an insulating material. The insulating material used for forming the protrusions 50b is, for example, a resin, and more specifically, an adhesive material such as a silicone resin or an epoxy resin. The semiconductor device 103 is similar to the semiconductor device 100, except that the protrusions 50b containing an insulating material are provided as the protrusions 50. Also in the semiconductor device 103, somewhere in one or more portions of the protrusions 50b are in contact with the hard brazing material 4 as in the semiconductor device 100.

The use of an insulating material to form the protrusions 50b prevents an electric field strength from rising, ensuring the reduction in partial discharge.

Further, unlike the semiconductor device 102 of Embodiment 3 in which the protrusions 50a are formed as the metal wire bumps, the semiconductor device 103 is advantageous in that micro metal foreign substances, which may possibly be generated during the formation of the metal wire bumps, are suppressed from mixing.

E. Embodiment 5

FIG. 1 is a cross-sectional view of a semiconductor device 104 according to Embodiment 5.

Figure 10:
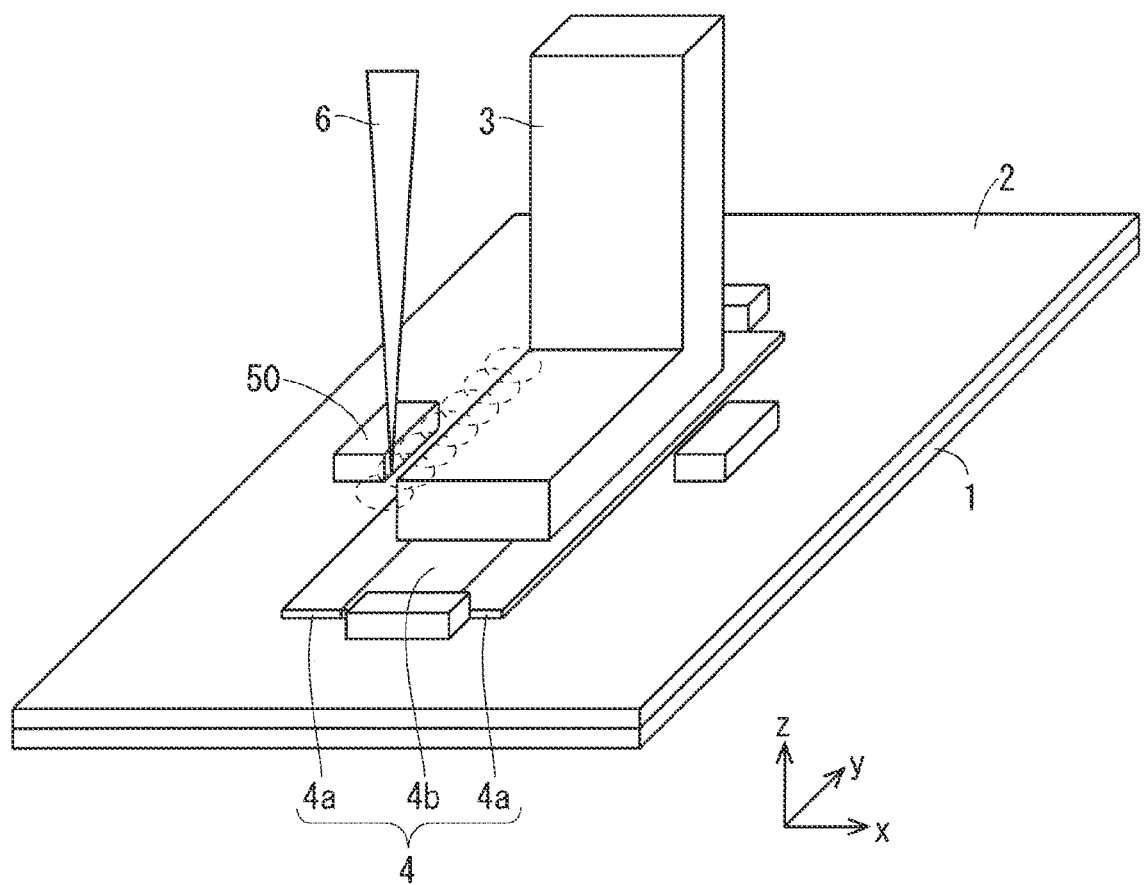
FIG. 10 is a partial perspective view of a semiconductor device of Embodiment 5.

FIG. 10 is a partial perspective view of the semiconductor device 104.

The configuration of the semiconductor device 104 is similar to that of the semiconductor device 100 of Embodiment 1, except how the metal terminal 3 and the metal circuit pattern 2 are bonded via the hard brazing material 4 described below. Also in the semiconductor device 104, somewhere in one or more portions of the protrusions 50 are in contact with the hard brazing material 4 as in the semiconductor device 100.

In the bonding of the metal terminal 3 to the metal circuit pattern 2 via the hard brazing material 4, the metal terminal 3 is bonded to the metal circuit pattern 2 at both ends along the extending direction of the metal terminal 3. In the bonding of the metal terminal 3 to the metal circuit pattern 2 via the hard brazing material 4, the metal terminal 3 is totally not bonded to the metal circuit pattern 2 in the middle portion along the extending direction of the metal terminal 3.

The manufacturing method of the semiconductor device 104 is the same as the manufacturing method of the semiconductor device 100 described in <A-2. Method of Manufacturing> within the scope described in <A-2. Method of Manufacturing>.

Figure 11:
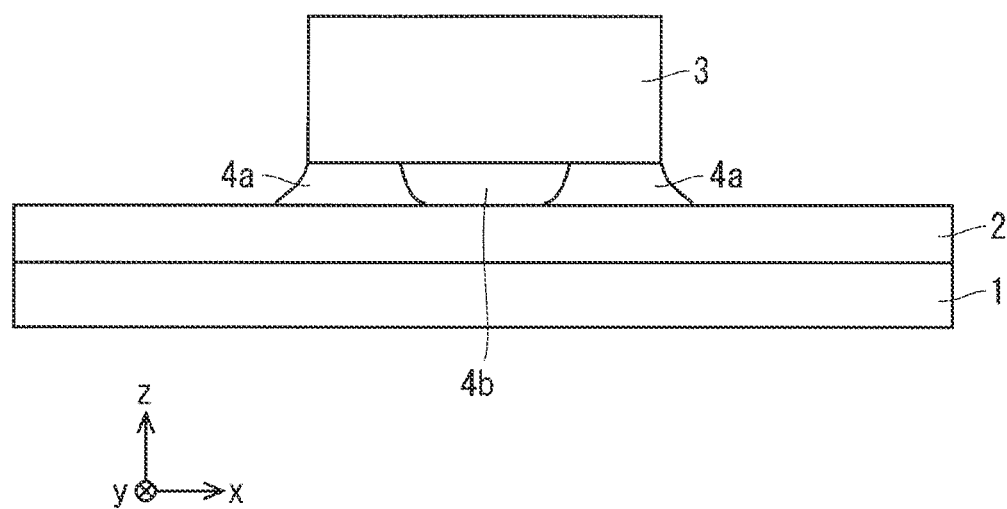
FIG. 11 is a partial top view of the semiconductor device of Embodiment 5.

In the method of manufacturing the semiconductor device 104, when the metal terminal 3 is bonded to the metal circuit pattern 2 via the hard brazing material in Step S5, in the hard brazing material 4, portions directly below the metal terminal 3 at both ends along the extending direction of the metal terminal 3 are melted, and in the hard brazing material 4, portion directly below the metal terminal 3 in the middle portion along the extending direction of the metal terminal 3 is totally not melted, as illustrated in FIGS. 10 and 11. In FIGS. 10 and 11, the portions of the hard brazing material 4 that are melted during manufacturing are shown as hard brazing materials 4a, and the portion of the hard brazing material 4 that is not melted during manufacturing is shown as hard brazing material 4b. In order to selectively melt the portions of the hard brazing material 4 directly below the metal terminal 3 at both ends along the extending direction of the metal terminal 3, for example, as illustrated in FIG. 10, a laser 6 is scanned at both ends of the terminal 3 along the extending direction of the metal terminal 3.

Alternatively, in the bonding of the metal terminal 3 to the metal circuit pattern 2 via the hard brazing material 4, the metal terminal 3 may have a portion that is not bonded to the metal circuit pattern 2 in the middle portion along the extending direction of the metal terminal 3 at least partially. In this case, when the metal terminal 3 is bonded to the metal circuit pattern 2 via the hard brazing material 4 in Step S5 in the flowchart of FIG. 4, in the hard brazing material 4, the portions directly below the metal terminal 3 at both ends along the extending direction of the metal terminal 3 are melted, and in the hard brazing material 4, the portion directly below the metal terminal 3 in the middle portion along the extending direction of the metal terminal 3 is not melted at least partially. For example, the portions of the hard brazing material 4 corresponding to the three sides of the outer peripheral portion of the bonding portion of the metal terminal 3 excluding a side at the bent portion of the metal terminal 3 may be melted, and the metal terminal 3 and the metal circuit pattern 2 may be bonded at the three-side portion via the material 4.

In the hard brazing material 4, the portion directly below the metal terminal 3 in the middle portion along the extending direction of the metal terminal 3 is not melted at least partially; therefore, in addition to the reduction in manufacturing cost due to the bonding with a shorter time, stabilization in quality due to the suppression of damage to the insulating substrate 11 and the material under the insulating substrate 11 are ensured. In the hard brazing material 4, if the portion directly below the metal terminal 3 in the middle portion along the extending direction of the metal terminal 3 is totally not melted, these effects are further enhanced.

The hard brazing material typically refers to the one with a melting point of 450° C. or higher. The tensile strength of a phosphor copper brazing material (BCup-5) representing a typical hard brazing material, is 33 to 39 kg/mm$^2$, while the tensile strength of a solder material (Sn-3.0Ag-0.5Cu) is 5 to 6 kg/mm$^2$, that is, the tensile strength of a phosphor copper brazing material is more than 6 times the tensile strength of the solder material. Accordingly, the tensile strength of the hard brazing material is higher than the tensile strength of the solder material; therefore, when the hard brazing material is used, a configuration may be adopted in which the metal terminal 3 and the metal circuit pattern 2 are bonded not in an entire manner on the surface thereof as in Embodiment 5.

F. Embodiment 6

FIG. 1 is a cross-sectional view of a semiconductor device 105 according to Embodiment 6.

Figure 12:
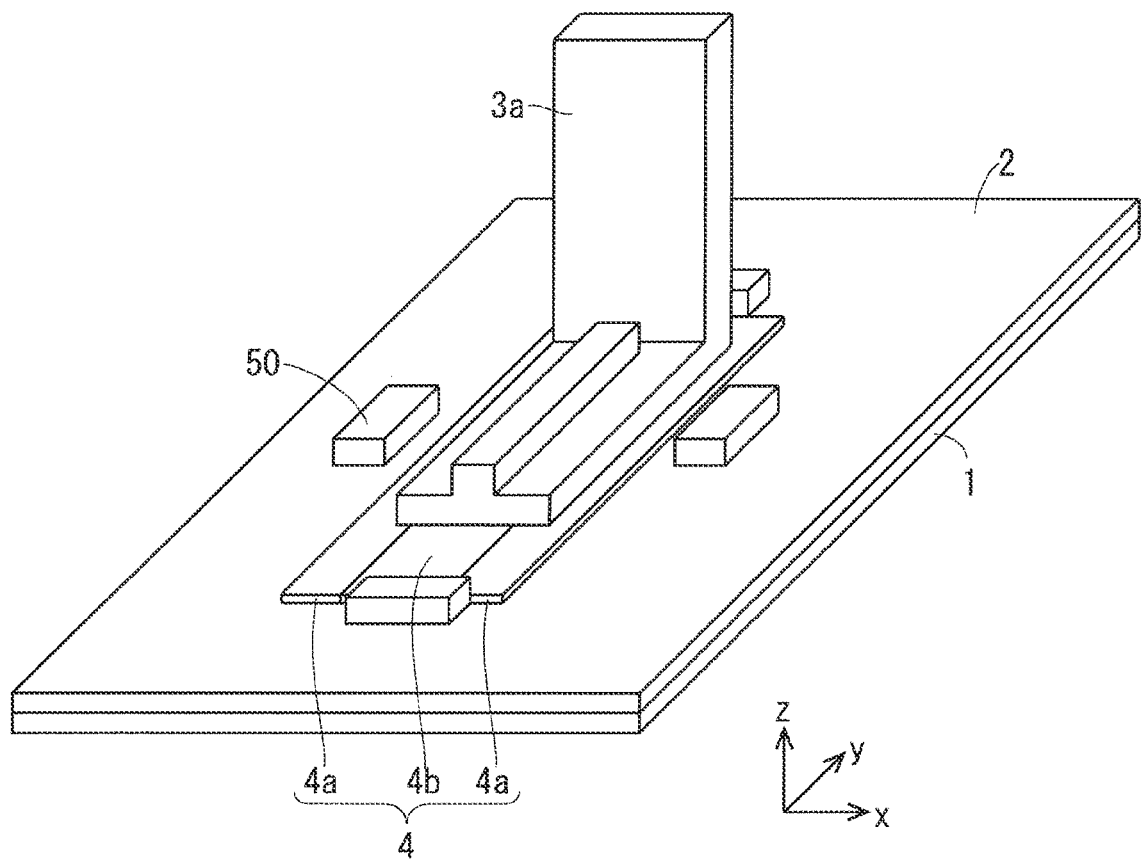
FIG. 12 is a partial perspective view of a semiconductor device of Embodiment 6.

FIG. 12 is a partial perspective view of the semiconductor device 105.

The semiconductor device 105 includes a metal terminal 3*a* instead of the metal terminal 3 as compared with the semiconductor device 104 of Embodiment 5. The configuration thereof is the same as that of the semiconductor device 104. Also in the semiconductor device 105, somewhere in one or more portions of the protrusions 50 are in contact with the hard brazing material 4 as in the semiconductor device 104.

Figure 13:
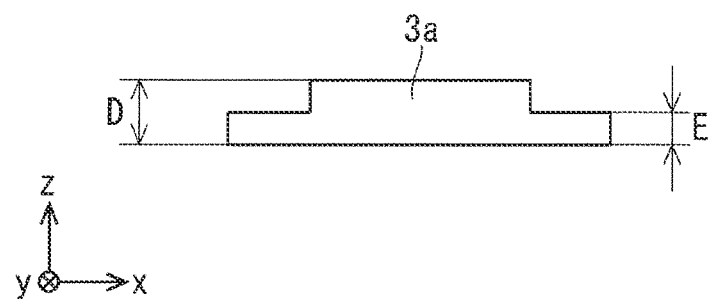
FIG. 13 is a partial sectional view of the semiconductor device of Embodiment 6.

In the thickness of the metal terminal 3*a*, portions at both ends along the extending direction of the metal terminal 3*a* are thinner than that of the middle portion in the portion bonded to the metal circuit pattern 2. That is, in the portion bonded to the metal circuit pattern 2, when D represents the thickness at the middle portion along the extending direction of the metal terminal 3*a*, and E represents the thickness at both ends along the extending direction of the metal terminal 3*a* (See FIG. 13), E is smaller than D. The configuration of the semiconductor device 105 is the same as the semiconductor device 104 of Embodiment 5, except that the metal terminal 3*a* is provided instead of the metal terminal 3.

E being smaller than D allows the hard brazing material 4 to be quickly melted to bond the metal terminal 3*a* and the metal circuit pattern 2 in a short time in the manufacturing process, and also suppresses the damage to the insulating substrate 11 and the material under the insulating substrate 11.

Further, it is desirable that the thickness E at both ends is D/2 or less. When E is D/2 or less, the effect of melting the hard brazing material 4 quickly and bonding is performed in a short time and the effect of suppressing the damage to the insulating substrate 11 and the material under the insulating substrate 11 are sufficiently obtained. Further, the metal terminals 3 of the semiconductor devices 100 to 103 of Embodiments 1 to 4 may be replaced with the metal terminal 3*a*.

G. Comparative Example

As a comparative example with Embodiments 1 to 6, consider the case where the semiconductor device does not have the protrusions 50 or the protrusion 51. When the semiconductor device does not have protrusions, as a manufacturing method for preventing the misalignment of the hard brazing material 4 in the manufacturing process, for example, the manufacturing method illustrated in the flowchart of FIG. 14 is conceivable.

First, an insulating substrate 11*b* with the metal circuit pattern 2 formed in the surface thereof, and no protrusions formed on the metal circuit pattern 2 is prepared (Step S11).

Next, the insulating substrate 11*b* is placed on a stage (Step S12).

Next, a brazing material supply jig 20 (see FIG. 15) is positioned, and the brazing material supply jig 20 is arranged (Step S13).

Figure 15:
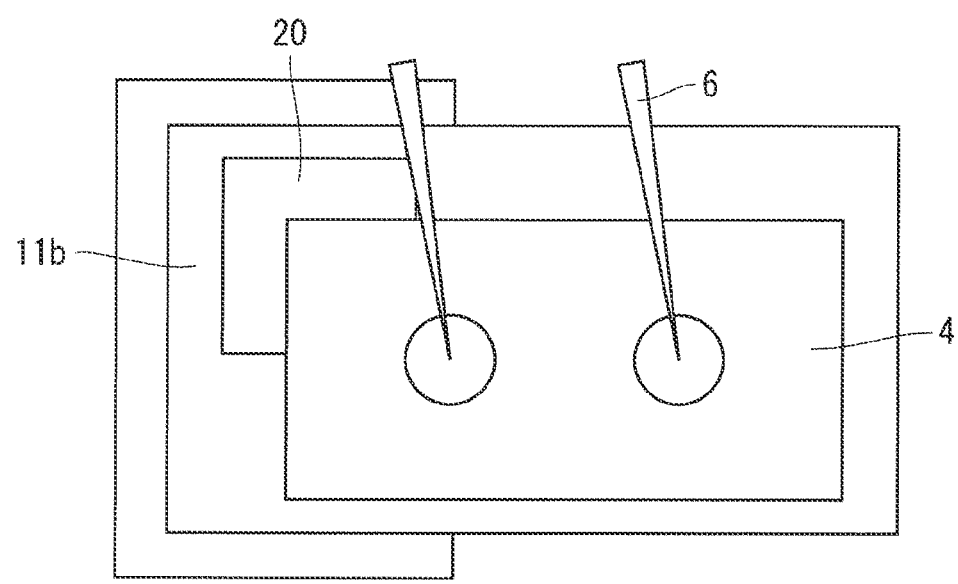
FIG. 15 is a diagram illustrating a manufacturing process of the semiconductor device of the comparative example.

Next, as illustrated in FIG. 15, the hard brazing material 4 is bonded to the insulating substrate 11*b* by a laser 6 (Step S14). In Step S14, the hard brazing material 4 is supplied and positioned by the brazing material supply jig 20.

Figure 16:
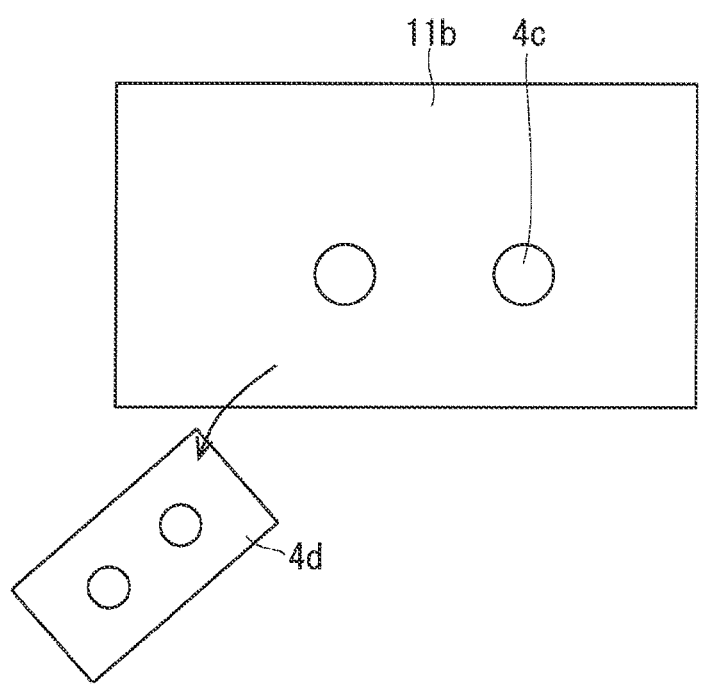
FIG. 16 is a diagram illustrating a manufacturing process of the semiconductor device of the comparative example.

Next, the brazing material supply jig 20 is removed from the insulating substrate 11*b* (Step S15). In Step S15, as illustrated in FIG. 16, in the hard brazing material 4, a portion that is not bonded to the insulating substrate 11*b* (hard brazing material 4*d*) is also removed from the insulating substrate 11*b*.

Next, the metal terminal 3 is placed on the portion of the hard brazing material 4, that is bonded to the insulating substrate 11*b* (hard brazing material 4*c*) (Step S16).

Figure 17:
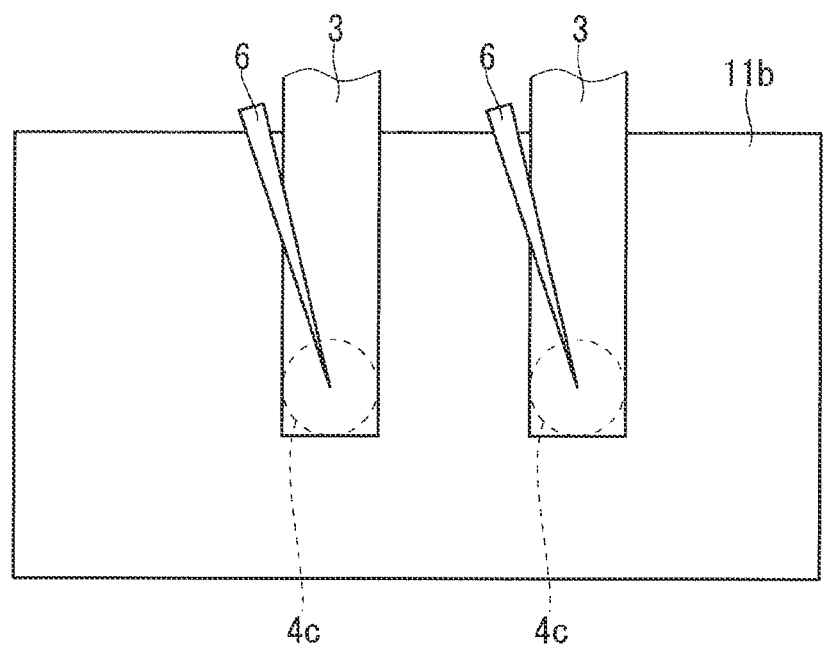
FIG. 17 is a diagram illustrating a manufacturing process of the semiconductor device of the comparative example.

Next, as illustrated in FIG. 17, the metal terminal 3 is bonded to the insulating substrate 11*b* by the laser 6 via the hard brazing material 4*c* (Step S17).

Next, the resin case 14 is attached to the insulating substrate 11*b* (Step S18), and the resin case 14 is filled with the sealing material 15 (Step S19).

As described above, in the manufacturing method illustrated in the flowchart of FIG. 14, the brazing material supply jig 20 is used for positioning the hard brazing material 4.

In the semiconductor devices 100 to 105 of Embodiments 1 to 6, the protrusions 50 or the protrusion 51 suppresses the misalignment of the hard brazing material 4; therefore, the misalignment of the hard brazing material is suppressed in a simpler manner than the manufacturing method illustrated in the flowchart of FIG. 14.

The embodiments can be combined, appropriately modified or omitted, without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an insulating substrate with a metal circuit pattern formed in a surface thereof; and
   a metal terminal bonded on the metal circuit pattern via a hard brazing material, wherein
   protrusions are provided on the metal circuit pattern, and
   the protrusions are in direct contact with the hard brazing material, and
   no upper surface of each of the protrusions is covered with the hard brazing material.

2. The semiconductor device according to claim 1, wherein
   the protrusions are arranged so as to surround a region where the metal terminal is in contact with the metal circuit pattern.

3. The semiconductor device according to claim 2, wherein
the protrusions are arranged so as to discretely surround the region where the metal terminal is in contact with the metal circuit pattern.

4. The semiconductor device according to claim 2, wherein
a protrusion of the protrusions is arranged so as to continuously surround the region where the metal terminal is in contact with the metal circuit pattern.

5. The semiconductor device according to claim 1, wherein
the protrusions is formed by bonding metal wires onto the metal circuit pattern.

6. The semiconductor device according to claim 1, wherein
the protrusion contains an insulating material.

7. The semiconductor device according to claim 6, wherein,
the insulating material is a resin.

8. The semiconductor device according to claim 1, wherein,
in the bonding between the metal terminal and the metal circuit pattern via the hard brazing material, the metal terminal is bonded to the metal circuit pattern at both ends along an extending direction of the metal terminal, and the metal terminal has a portion which is not bonded to the metal circuit pattern in a middle portion along the extending direction of the metal terminal at least partially.

9. The semiconductor device according to claim 8, wherein,
in the bonding between the metal terminal and the metal circuit pattern via the hard brazing material, the metal terminal is bonded to the metal circuit pattern at both ends along an extending direction of the metal terminal, and the metal terminal is totally not bonded to the metal circuit pattern in a middle portion along the extending direction of the metal terminal.

10. The semiconductor device according to claim 1, wherein,
in a thickness of the metal terminal, portions at both ends along the extending direction of the metal terminal are thinner than that of the middle portion in a portion bonded to the metal circuit pattern.

11. The semiconductor device according to claim 1, further comprising
a semiconductor element, wherein
the semiconductor element is bonded onto the metal circuit pattern.

12. A semiconductor device comprising:
an insulating substrate with a metal circuit pattern formed in a surface thereof; and
a metal terminal bonded on the metal circuit pattern via a hard brazing material, wherein
protrusions are provided on the metal circuit pattern,
the protrusions are in contact with the hard brazing material, and
the protrusion contains an insulating material.

13. A semiconductor device comprising:
an insulating substrate with a metal circuit pattern formed in a surface thereof; and
a metal terminal bonded on the metal circuit pattern via a hard brazing material, wherein
protrusions are provided on the metal circuit pattern,
the protrusions are in contact with the hard brazing material, and
in the bonding between the metal terminal and the metal circuit pattern via the hard brazing material, the metal terminal is bonded to the metal circuit pattern at both ends along an extending direction of the metal terminal, and the metal terminal has a portion which is not bonded to the metal circuit pattern in a middle portion along the extending direction of the metal terminal at least partially.

14. A semiconductor device comprising:
an insulating substrate with a metal circuit pattern formed in a surface thereof; and
a metal terminal bonded on the metal circuit pattern via a hard brazing material, wherein
protrusions are provided on the metal circuit pattern,
the protrusions are in contact with the hard brazing material, and
in a thickness of the metal terminal, portions at both ends along the extending direction of the metal terminal are thinner than that of the middle portion in a portion bonded to the metal circuit pattern.

\* \* \* \* \*